United States Patent
Zhang et al.

(10) Patent No.: US 8,460,977 B2
(45) Date of Patent: Jun. 11, 2013

(54) MESA TERMINATION STRUCTURES FOR POWER SEMICONDUCTOR DEVICES AND METHODS OF FORMING POWER SEMICONDUCTOR DEVICES WITH MESA TERMINATION STRUCTURES

(75) Inventors: Qingchun Zhang, Cary, NC (US); Anant K. Agarwal, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/338,620

(22) Filed: Dec. 28, 2011

(65) Prior Publication Data
US 2012/0122305 A1    May 17, 2012

Related U.S. Application Data

(62) Division of application No. 12/189,551, filed on Aug. 11, 2008, now Pat. No. 8,097,919.

(51) Int. Cl.
*H01L 21/335* (2006.01)

(52) U.S. Cl.
USPC ............. 438/142; 438/39; 438/343; 438/494; 438/496; 438/519; 257/E29.012; 257/E29.328

(58) Field of Classification Search
USPC .................. 438/39, 142, 343, 494, 496, 519; 257/E29.012, E29.328
See application file for complete search history.

(56) References Cited

U.S. PATENT DOCUMENTS

| 4,242,690 A | * | 12/1980 | Temple ..................... 257/493 |
| 4,742,377 A | | 5/1988 | Einthoven |
| 4,927,772 A | | 5/1990 | Arthur et al. |
| 5,233,209 A | | 8/1993 | Rodgers et al. |

(Continued)

FOREIGN PATENT DOCUMENTS

| CN | 1124408 A | 6/1996 |
| CN | 1745479 A | 3/2006 |

(Continued)

OTHER PUBLICATIONS

Asano et al., "Dynamic Characteristics of 6.2kV High Voltage 4H-SiC pn Diode with Low Loss", Transactions of the Institute of Electrical Engineers of Japan, Part D Inst. Electr. Eng. Japan, vol. 123D, No. 5, May 2003, pp. 623-627, XP8124184.

(Continued)

*Primary Examiner* — Andy Huynh
(74) *Attorney, Agent, or Firm* — Myers Bigel Sibley & Sajovec, PA

(57) ABSTRACT

A method of forming an electronic device, including forming a preliminary buffer layer on a drift layer, forming a first layer on the preliminary buffer layer, selectively etching the first layer to form a first mesa that exposes a portion of the preliminary buffer layer, and selectively etching the exposed portion of the preliminary buffer layer to form a second mesa that covers a first portion of the drift layer, that exposes a second portion of the drift layer, and that includes a mesa step that protrudes from the first mesa. Dopants are selectively implanted into the drift layer adjacent the second mesa to form a junction termination region in the drift layer. Dopants are selectively implanted through a horizontal surface of the mesa step into a portion of the drift layer beneath the mesa step to form a buried junction extension in the drift layer.

9 Claims, 12 Drawing Sheets

U.S. PATENT DOCUMENTS

| | | | |
|---|---|---|---|
| 5,726,469 | A | 3/1998 | Chen |
| 5,804,483 | A | 9/1998 | Harris |
| 5,914,500 | A | 6/1999 | Bakowski et al. |
| 5,967,795 | A * | 10/1999 | Bakowsky et al. ............ 438/494 |
| 5,977,605 | A | 11/1999 | Bakowsky et al. |
| 6,083,814 | A | 7/2000 | Nilsson |
| 6,696,705 | B1 | 2/2004 | Barthelmess et al. |
| 7,026,650 | B2 | 4/2006 | Ryu et al. |
| 7,144,797 | B2 | 12/2006 | Chow et al. |
| 7,304,363 | B1 * | 12/2007 | Shah ............................ 257/492 |
| 7,649,213 | B2 | 1/2010 | Hatakeyama et al. |
| 7,838,377 | B2 * | 11/2010 | Zhang et al. .................. 438/343 |
| 7,875,946 | B2 | 1/2011 | Yasuoka et al. |
| 2005/0205872 | A1 | 9/2005 | Hallin et al. |
| 2006/0065899 | A1 | 3/2006 | Hatakeyama et al. |
| 2006/0068571 | A1 | 3/2006 | Chow et al. |
| 2006/0118900 | A1 | 6/2006 | Zeghbroeck |
| 2006/0273346 | A1 | 12/2006 | Pfirsch |
| 2007/0001230 | A1 | 1/2007 | Lee et al. |
| 2007/0120148 | A1 | 5/2007 | Nogome |
| 2007/0241427 | A1 | 10/2007 | Mochizuki et al. |
| 2008/0001158 | A1 | 1/2008 | Das et al. |
| 2008/0006848 | A1 | 1/2008 | Chen et al. |
| 2008/0105949 | A1 | 5/2008 | Zhang et al. |
| 2009/0212301 | A1 | 8/2009 | Zhang et al. |
| 2010/0289032 | A1 | 11/2010 | Zhang et al. |

FOREIGN PATENT DOCUMENTS

| | | |
|---|---|---|
| EP | 0 176 778 A2 | 4/1986 |
| EP | 0 389 863 A1 | 10/1990 |
| EP | 1 806 787 A1 | 7/2007 |
| JP | 55/006887 A | 1/1980 |
| JP | A-55-006887 | 1/1980 |
| JP | 3-225870 | 10/1991 |
| JP | 4-092434 A | 3/1992 |
| JP | 2001-035857 A | 2/2001 |
| JP | 2002-516027 A | 5/2002 |
| JP | 2007-173841 A | 7/2007 |
| WO | WO 96/03774 | 2/1996 |
| WO | WO 97/08754 | 3/1997 |
| WO | WO 97/08754 A2 | 3/1997 |
| WO | WO 98/02924 A2 | 1/1998 |
| WO | WO 98/32178 A1 | 7/1998 |
| WO | WO 2006/135031 A2 | 12/2006 |
| WO | WO 2006/135031 A3 | 12/2006 |
| WO | WO 2007/040710 A1 | 4/2007 |

OTHER PUBLICATIONS

Communication pursuant to Article 94(3)EPC, European Patent Application No. 09 713 922.4, Jan. 13, 2012, 5 pages.

European Search Report for corresponding EP patent application No. 09163424.6 dated Apr. 9, 2010.

Gao Y. et al., "Investigation of boron diffusion in 6H-SiC", *Applied Physics Letters*, vol. 83, No. 5, Aug. 4, 2003, pp. 905-907.

Gao, Y. et al., "Selective doping of 4H-SiC by codiffusion of aluminum and boron", *Journal of Applied Physics*, vol. 90, No. 11, Dec. 1, 2001, pp. 5647-5651.

Grekhov, I.V. et al., "High-Voltage (900 V) 4H-SiC Schottky Diodes with a Boron-Implanted guard p-n Junction", *Semiconductors*, vol. 42, No. 2, 2008, pp. 211-214.

International Preliminary Report on Patentability Corresponding to International Application No. PCT/US2010/026632; Date of Mailing: Jun. 10, 2011; 15 pages.

International Search Report and Written Opinion (13 pages) corresponding to International Application No. PCT/US2008/010538; Mailing Date: Dec. 22, 2008.

International Search Report and Written Opinion, International Application No. PCT/US2009/000734, Apr. 23, 2009.

International Search Report Corresponding to International Application No. PCT/US2012/023263; Date of Mailing: Aug. 6, 2012; 15 Pages.

Japanese Office Action Corresponding to Japanese Patent Application No. 2009-186765; Mailing Date: May 8, 2012; Foreign Text, 2 Pages, English Translation Thereof, 2 Pages.

Kinoshita et al., "Guard Ring Assisted RESURF: A New Termination Structure Providing Stable and High Breakdown Voltage for SiC Power Devices," Tech. Digest of ISPSD '02, pp. 253-256.

Losee et al., "High Voltage 4H-SiC PiN rectifiers with single-implant, multi-zone JTE termination", Power Semiconductor Devices and ICS, 2004; Proceedings ISPSD 2004; The 16th International Symposium on Kitakyushu Int. Conf. Ctr. Japan, May 24-27, 2004; Piscataway, NJ, USA, IEEE, May 24, 2004, pp. 301-304, XP010723398.

Merrett, J.N. et al., "Fabrication of Self-Aligned Graded Junction Termination Extensions with Applications to 4H-SiC P-N Diodes", *Journal of Electronic Materials*, vol. 31, No. 6, 2002, pp. 635-639.

Notification of the First Office Action, Chinese Patent Application No. 200980111322.0, Apr. 28, 2012, 10 pages.

Notification of Transmittal of the International Search Report and the Written Opinion of the International Searching Authority, or the Declaration; International Search Report; Written Opinion of the International Searching Authority—Corresponding to International Application No. PCT/US2010/026632; Date of Mailing: Oct. 8, 2010; 16 pages.

Singh et al., "Planar Terminations in 4H-SiC Schottky Diodes with Low Leakage and High Yields," ISPSD '97, pp. 157-160.

Solmi, S. et al., "High-concentration boron diffusion in silicon: Simulation of the precipitation phenomena", *Journal of Applied Physics*, vol. 68, No. 7, Oct. 1, 1990, pp. 3250-3258.

Soloviev, S. I. et al., "Doping of 6H-SiC by selective diffusion of boron", *Applied Physics Letters*, vol. 77, No. 24, Dec. 11, 2000, pp. 4004-4006.

Stengl et al., "Variation of Lateral Doping—A New Concept to Avoid High Voltage Breakdown of Planar Junctions", International Electron Devices Meeting; Washington, Dec. 1-4, 1985; pp. 154-157, XP002013050.

Stengl et al., Variation of Lateral Doping as a Field Terminator for High-Voltage Power Devices, IEEE Transactions on Electron Devices; vol. ED-33, No. 3, Mar. 1986, pp. 426-428, XP000836911.

Sundaresan et al., "Ultra-low resistivity Al+ implanted 4H-SiC obtained by microwave annealing and a protective graphite cap", *Solid-State Electronics* vol. 52, 2008, pp. 140-145, XP022360431.

Ueno et al., "The Guard-Ring Termination for High-Voltage SiC Schottky Barrier Diodes," IEEE Electron Device Letters, vol. 16, No. 7, Jul. 1995, pp. 331-332.

Vassilevski et al., "High Voltage Silicon Carbide Schottky Diodes with Single Zone Junction Termination Extension", Materials Science Forum, 2007 Trans Tech Publications, vols. 556-557 (2007) pp. 873-876, XP8124186.

Yilmaz, "Optimization and Surface Charge Sensitivity of High Voltage Blocking Structures with Shallow Junctions," IEEE Transactions on Electron Devices, vol. 38, No. 3, Jul. 1991, pp. 1666-1675.

Japanese Office Action Corresponding to Japanese Patent Application No. 2010-533058; Mailing Date: Nov. 9, 2012; Foreign Text, 3 Pages, English Translation Thereof, 4 Pages.

* cited by examiner

UMOSFET

N-IGBT

P-IGBT

N-BJT

N-GTO

MESA TERMINATION STRUCTURES FOR POWER SEMICONDUCTOR DEVICES AND METHODS OF FORMING POWER SEMICONDUCTOR DEVICES WITH MESA TERMINATION STRUCTURES

CLAIM OF PRIORITY

The present application is a divisional of and claims priority from U.S. application Ser. No. 12/189,551, filed Aug. 11, 2008, now U.S. Pat. No. 8,097,919, which is assigned to the assignee of the present application, the disclosure of which is hereby incorporated herein by reference as if set forth fully.

FIELD OF THE INVENTION

The present invention relates microelectronic devices, and more particularly to edge terminations for power semiconductor devices.

BACKGROUND

High voltage silicon carbide (SiC) devices, such as Schottky diodes, can handle voltages above about 600V or more. Such diodes may handle as much as about 100 amps or more of current, depending on their active area. High voltage Schottky diodes have a number of important applications, particularly in the field of power conditioning, distribution and control. Other types of high voltage semiconductor devices, such as MOSFETs, GTOs, IGBTs, BJTs, etc., have been fabricated using silicon carbide.

A conventional SiC power device, such as a SiC Schottky diode structure, has an n-type SiC substrate on which an n− epitaxial layer, which functions as a drift region, is formed. The device typically includes a Schottky contact formed directly on the n− layer. Surrounding the Schottky contact is a p-type JTE (junction termination extension) region that is typically formed by ion implantation. The implants may be aluminum, boron, or any other suitable p-type dopant. The purpose of the JTE region is to reduce electric field crowding at the edges of the junction, and to reduce or prevent the depletion region from interacting with the surface of the device. Surface effects may cause the depletion region to spread unevenly, which may adversely affect the breakdown voltage of the device. Other termination techniques include guard rings and floating field rings that may be more strongly influenced by surface effects. A channel stop region may also be formed by implantation of n-type dopants, such as nitrogen or phosphorus, in order to reduce extension of the depletion region toward the edge of the device.

Additional conventional terminations of SiC Schottky diodes are described in "Planar Terminations in 4H—SiC Schottky Diodes With Low Leakage And High Yields" by Singh et al., ISPSD '97, pp. 157-160. A p-type epitaxy guard ring termination for a SiC Schottky Barrier Diode is described in "The Guard-Ring Termination for High-Voltage SiC Schottky Barrier Diodes" by Ueno et al., IEEE Electron Device Letters, Vol. 16, No. 7, July, 1995, pp. 331-332. Additionally, other termination techniques are described in published PCT Application No. WO 97/08754 entitled "SiC Semiconductor Device Comprising A PN Junction With A Voltage Absorbing Edge."

In addition to junction termination extension (JTE), multiple floating guard rings (MFGR) and field plates (FP) are commonly used termination schemes in high voltage silicon carbide devices. Another conventional edge termination technique is a mesa edge termination. However, the presence of a mesa termination may cause a high electric field to occur at the mesa corner, even if a junction termination extension or guard ring is present. Over-etching of the mesa can exacerbate the problem of electric field crowding at the mesa corner. A high electric field at the mesa corner may result in a much lower breakdown voltage than would otherwise be expected for a given drift layer thickness and doping.

A conventional mesa-terminated PIN diode is illustrated in FIG. 1. As shown therein, a PIN diode 10 includes an n− drift layer 12 between a p+ layer 16 and an n+ substrate 14. FIG. 1 illustrates one half of a PIN-structure; the structure may include mirror image portions (not shown). An anode contact 23 is on the p+ layer 16, and a cathode contact 25 is on the n+ substrate 14. The p+ layer 16 is formed as a mesa on the n− drift layer 12. A junction termination extension (JTE) region 20 including a plurality of JTE zones 20A, 20B, 20C is provided in the n− drift layer 12 adjacent the p+ mesa 16. The JTE zones 20A, 20B, 20C are p-type regions that may have levels of charge that decrease outwardly with distance from the PN junction between the p+ mesa 16 and the n− drift layer 12. Although three JTE zones 20A, 20B, 20C are illustrated, more or fewer JTE zones may be provided.

As shown in FIG. 1, the n− drift layer 12 adjacent the p+ mesa 16 may be slightly over-etched due, for example, to difficulties in etch process control, so that a sidewall 12A of the n-drift layer 12 beneath the p+ mesa 16 may be exposed. Over-etching of up to about 3000 Å may occur in some cases. To protect the exposed sidewall 12A, a sidewall implant may be performed in which p-type impurities are implanted into the sidewall 12A to form a sidewall implant region 22.

In conventional mesa-terminated structures, such as the PIN diode structure 10 illustrated in FIG. 1, field crowding may occur at or near the mesa corners 29, resulting in high electric field strengths at the corners 29. These high field strengths can reduce the breakdown voltage of the device. For example, a conventional mesa-terminated PIN diode structure that has a theoretical breakdown voltage of 12 kV, based on thickness and doping of the drift layer and the JTE design, may have an effective breakdown voltage of only 8 kV.

SUMMARY

An electronic device according to some embodiments includes a drift layer having a first conductivity type, and a buffer layer on the drift layer and having a second conductivity type, opposite the first conductivity type. The buffer layer forms a first mesa that extends across a first portion of the drift layer and forms a P-N junction with the drift layer, and that exposes a second portion of the drift layer. The device further includes a second layer on the buffer layer opposite the drift layer and having the second conductivity type. The second layer forms a second mesa that extends across a first portion of the buffer layer and that exposes a second portion of the buffer layer adjacent the exposed second portion of the drift layer. A junction termination region is in the exposed second portion of the drift layer and has the second conductivity type. A buried junction extension having the second conductivity type is in the drift layer. The buried junction extension is in direct contact with the buffer layer, and extends at least partially beneath the buffer layer.

In some embodiments, the buffer layer may have a thickness of about 0.2 to 0.3 μm. The buffer layer may have a net doping concentration that is greater than a net doping concentration of the drift layer and/or that is less than a net doping concentration of the second layer. In some embodiments, the net doping concentration of the buffer layer is about $1 \times 10^{17}$ cm$^{-3}$.

The buried junction extension has a net doping concentration of between about $1\times10^{16}$ cm$^{-3}$ and about $1\times10^{18}$ cm$^{-3}$ and extends into the drift layer to a depth beneath the buffer layer of about 0.3 μm. The buried junction extension may include an implanted region.

The first mesa is on a surface of the drift layer and may extend laterally past the second mesa relative to the surface of the drift layer by a width of about 10 μm or more.

The junction termination region may include a junction termination extension (JTE) region including a plurality of JTE zones. In some embodiments, the buried junction extension is laterally adjacent to and in direct contact with a first one of the JTE zones. The buried junction extension and the first JTE zone may have the same doping concentration.

In some embodiments, a first side of the buried junction extension is vertically aligned with a sidewall of the first mesa and a second side of the buried junction extension is vertically aligned with a sidewall of the second mesa.

The P-N junction between the drift layer and the buffer layer may be configured to sustain a reverse voltage of at least about 1 kV.

In some embodiments, the drift layer and the buffer layer include silicon carbide layers.

A power semiconductor device according to further embodiments includes a drift layer having a first conductivity type, and a first layer having a second conductivity type, opposite the first conductivity type, on the drift layer. The first layer may include a mesa that extends across a first portion of a surface of the drift layer and forms a P-N junction with the drift layer and that exposes a second portion of the surface of the drift layer. The first layer may include a main portion and a step portion that extends from the main portion laterally across the surface of the drift layer and that has a reduced thickness compared to the main portion of the first layer. The device further includes a buried junction extension having the second conductivity type at a surface of the drift layer beneath the step portion, and a junction termination at the surface of the drift layer and extending away from the buried junction extension. The junction termination has the second conductivity type and is in direct contact with the buried junction extension.

An electronic device according to further embodiments includes a drift layer having a first conductivity type, a buffer layer having a second conductivity type, opposite the first conductivity type, on the drift layer and forming a P-N junction with the drift layer, and a junction termination extension region having the second conductivity type in the drift layer adjacent the P-N junction. The buffer layer includes a step portion that extends over a buried portion of the junction termination extension.

Methods of forming electronic devices according to some embodiments include forming a preliminary buffer layer having a second conductivity type on a drift layer having a first conductivity type, opposite the second conductivity type, forming a first layer having the second conductivity type on the buffer layer, selectively etching the first layer to form a first mesa that exposes a portion of the preliminary buffer layer, and selectively etching the exposed portion of the preliminary buffer layer to form a second mesa that covers a first portion of the drift layer, that exposes a second portion of the drift layer, and that includes a mesa step that protrudes from beneath the first mesa. The methods further include selectively implanting second conductivity type dopants into the drift layer adjacent the second mesa to form a junction termination region in the drift layer, and selectively implanting second conductivity type dopants through the mesa step into a portion of the drift layer beneath the mesa step to form a buried junction extension in the drift layer.

DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION

Figure 1:
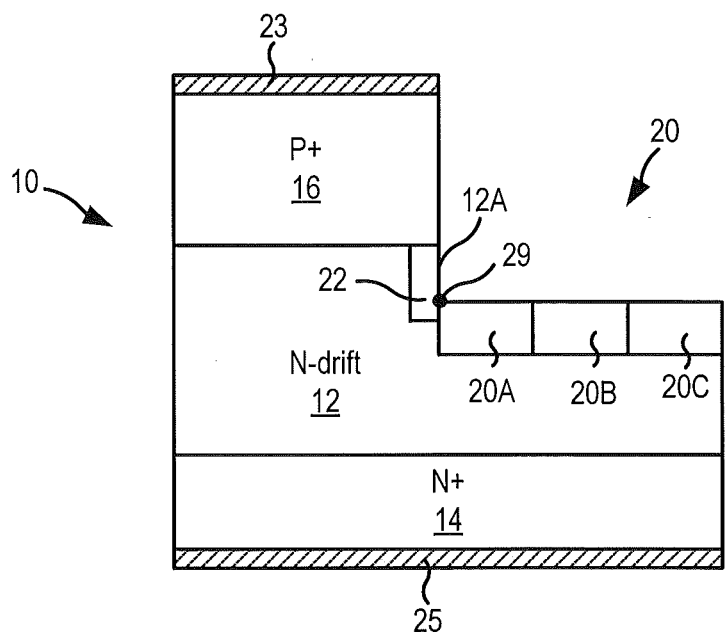
FIG. 1 is a cross-sectional view of a conventional mesa terminated PIN diode structure.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below," "above," "upper," "lower," "horizontal," "lateral," "vertical," "beneath," "over," etc., may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

Figure 2A:
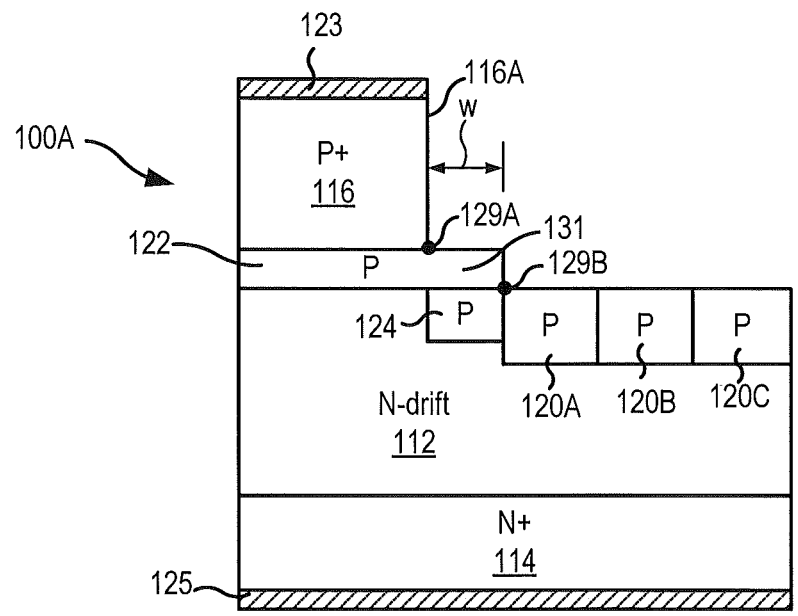
FIGS. 2A and 2B are cross-sectional views of mesa terminated PIN diode structures according to some embodiments of the present invention.
Figure 2B:
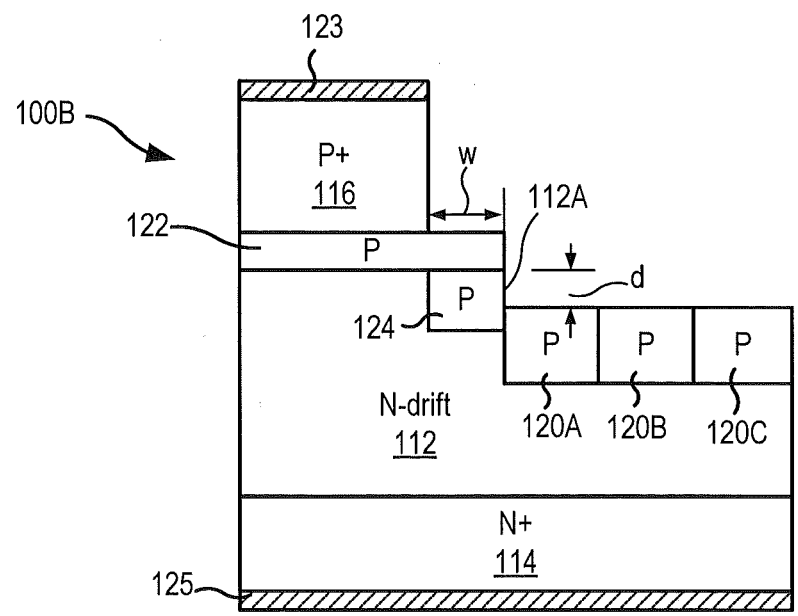

Mesa-terminated semiconductor device structures according to some embodiments of the invention are illustrated in FIGS. 2A and 2B, which illustrate one half of respective PIN-structures. Referring to FIG. 2A, a PIN diode 100A according to some embodiments includes an n− drift layer 112 on an n+ layer 114. The drift layer 112 may be formed, for example, from n-type silicon carbide of the 2H, 4H, 6H, 3C and/or 15R polytype having a dopant concentration of about $2 \times 10^{14}$ to about $1 \times 10^{17}$ cm$^{-3}$. The thickness and doping of the n-drift layer 112 may be chosen to provide a desired blocking voltage and/or on-resistance. For example, for a device having a blocking voltage of 10 kV, the n− drift layer 112 may have a thickness of about 100 μm and a doping of about $2 \times 10^{14}$ cm$^{-3}$. The n+ layer 114 may be a growth substrate, and in some embodiments may include a bulk single crystal of 2H, 4H, 6H, 3C and/or 15R polytype on- or off-axis silicon carbide. In some embodiments, the n− drift layer 112 may comprise a bulk single crystal 4H- or 6H—SiC substrate, and the n+ layer 114 may comprise an implanted or epitaxial region on the n− drift layer 112.

A p-type buffer layer 122 is formed as a first mesa on the n− drift layer 112, and a p+ layer 116 is formed as a second mesa on the buffer layer 122. The buffer layer 122 forms a PN junction with the n− drift layer 112. Both the buffer layer and the p+ layer 116 are formed as mesas on the drift layer 112. However, the buffer layer 122 is formed to extend beyond a sidewall 116A of the p+ mesa 116 by a distance w of about 10 μm, and thereby defines a p-type mesa step 131 that extends beyond the sidewall 116A of the p+ mesa 116. The buffer layer 122 may have a thickness of about 0.2 μm to about 0.3 μm. Because the buffer layer 122 may be formed as an epitaxial layer, the thickness and doping of the buffer layer 122 can be precisely controlled. The buffer layer may have a doping concentration of about $1 \times 10^{16}$ to about $1 \times 10^{18}$ cm$^{-3}$.

An anode contact 123 is on the p+ layer 116, and a cathode contact 125 is on the n+ layer 114.

A junction termination extension (JTE) region 120 including a plurality of JTE zones 120A, 120B, 120C is provided in the n− drift layer 112 adjacent the buffer layer mesa 122. The JTE zones 120A, 120B, 120C are p-type regions that may have levels of charge that decrease outwardly with distance from the PN junction between the buffer layer 122 and the n− drift layer 112. Although three JTE zones 120A, 120B, 120C are illustrated, more or less JTE zones may be provided. For example, in some embodiments, the JTE region 120 may include fifteen JTE zones having levels of charge that decrease monotonically with distance from the PN junction between the buffer layer 122 and the n− drift layer 112. In some embodiments, the first JTE zone 120A may have a doping concentration of about $2 \times 10^{17}$ cm$^{-3}$ and may extend about 0.5 μm into the drift layer 112, for a total charge of about $1 \times 10^{13}$ cm$^{-2}$.

In addition, a p-type buried junction extension 124 is provided in the n− drift layer 112 beneath the mesa step 131 defined by the buffer layer mesa 122. The buried junction extension 124 may contact the JTE region 120 and may have a similar doping level as the first JTE zone 120A. The buried junction extension 124 may be formed by implantation of dopants through the step 131 of the buffer layer mesa 122, and therefore may be self-aligned with the sidewall 116A of the p+ mesa 116. Furthermore, the buried junction extension 124 may extend a shorter distance into the n-type drift layer 112 than the first JTE zone 120A. For example, the buried junction extension 124 may extend about 0.3 μm into the n-type drift layer 112, while the first JTE zone 120A may extend about 0.5 μm into the n-type drift layer 112.

By providing the mesa step 131 defined by the buffer layer 122 and the buried junction extension 124, the corner 129A where the p+ mesa 116 meets the buffer layer 122 and the corner 129B where the buffer layer mesa 122 meets the drift layer 112 may be more protected against high electric fields when the device is in a voltage blocking state compared with a conventional mesa termination. Accordingly, a peak electric field strength may be reduced in a device according to embodiments of the invention, and effective breakdown voltages can be increased. Furthermore, device yields can be increased, as over-etching may not cause an unacceptable increase in the peak electric field in the device.

As shown in FIG. 2B, the n− drift layer 112 may be slightly over-etched adjacent the buffer layer mesa 122 due, for example, to difficulties in etch process control. Over-etching of up to about 3000 Å may occur in some cases. As a result of over-etching, a sidewall 112A of the n-drift layer 112 beneath the buffer layer 122 may be exposed. However, the exposed portion of the sidewall may be within the region occupied by the buried junction extension 124, so that the n− drift layer may not extend to the exposed sidewall. To further protect the exposed sidewall 112A, an optional sidewall implant may be performed in which p-type impurities are implanted into the exposed sidewall.

Etch rates may vary across a wafer, particularly when silicon carbide is etched using a dry etching technique. However, even though over-etching may occur when the p-type layers 122, 116 are etched to form the first and second mesas, such over-etching may not have as great an impact on device performance, thereby increasing yields of usable devices on a wafer.

FIGS. 3A to 3E illustrate other types of devices in which mesa edge terminations according to various embodiments of the invention may be employed. In each case, the device includes a drift layer, a buffer layer on the drift layer that forms a step, and a buried junction extension in the drift layer beneath the step, wherein both the buffer layer and the buried junction extension have a conductivity type that is opposite the conductivity type of the drift layer. As illustrated in the embodiments of FIGS. 3A to 3E, the drift layer of the device may be p-type or n-type, and the buffer layer and buried junction may have the opposite conductivity type (i.e. n-type or p-type).

Figure 3A:
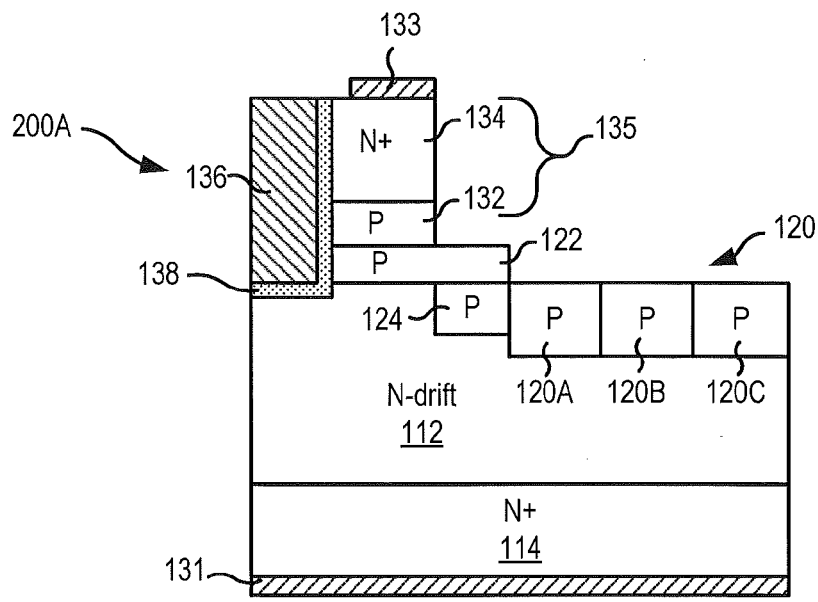
FIGS. 3A to 3E are cross-sectional views of mesa terminated power semiconductor structures according to some embodiments of the present invention.

For example, referring to FIG. 3A, a UMOSFET (U-shaped metal-oxide-semiconductor field effect transistor) structure 200A according to some embodiments includes an n-type drift layer 112 on an n+ layer 114. A p-type buffer layer 122 is formed as a first mesa on the n-type drift layer 112, and a second mesa 135 including a p-type body layer 132 and an n+ source layer 134 is formed on the buffer layer 122. The buffer layer 122 forms a mesa step that extends over the drift layer 112 past a first sidewall of the second mesa 135, and a buried junction extension 124 is under the step. A gate oxide 138 is formed on a second surface of the second mesa 135 opposite the first surface, and a gate electrode 136 is on the gate oxide 138.

A junction termination extension (JTE) region 120, including p-type JTE zones 120A, 120B, 120C, is formed at the surface of the n− drift layer 112 adjacent the buried junction extension 124. Source and drain ohmic contacts 133, 131 are formed on the n+ layers 134, 114, respectively.

Figure 3B:
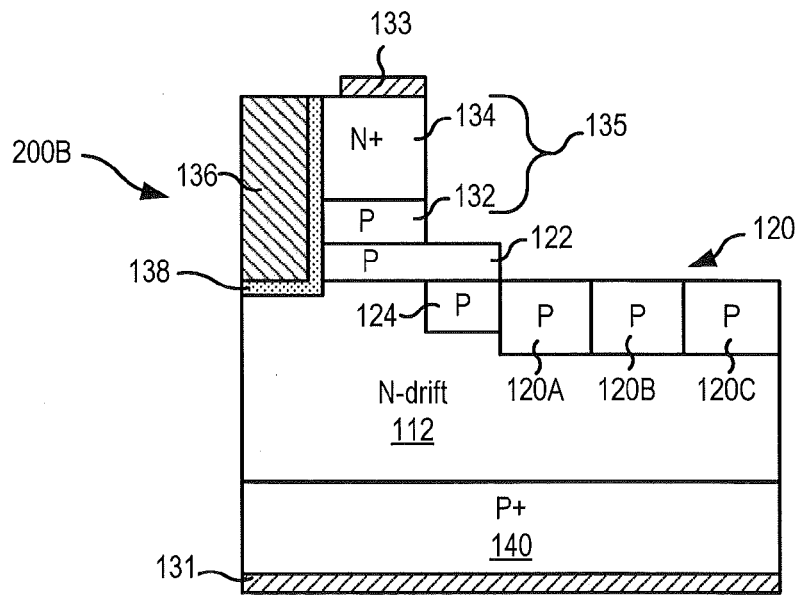

An n-IGBT (insulated gate bipolar transistor) structure 200B according to some embodiments is illustrated in FIG. 3B. The n-IGBT 200B has a similar structure as the UMOSFET 200A illustrated in FIG. 3A, except that the n-type drift layer 112 is formed on a p+ emitter layer 140.

Figure 3C:
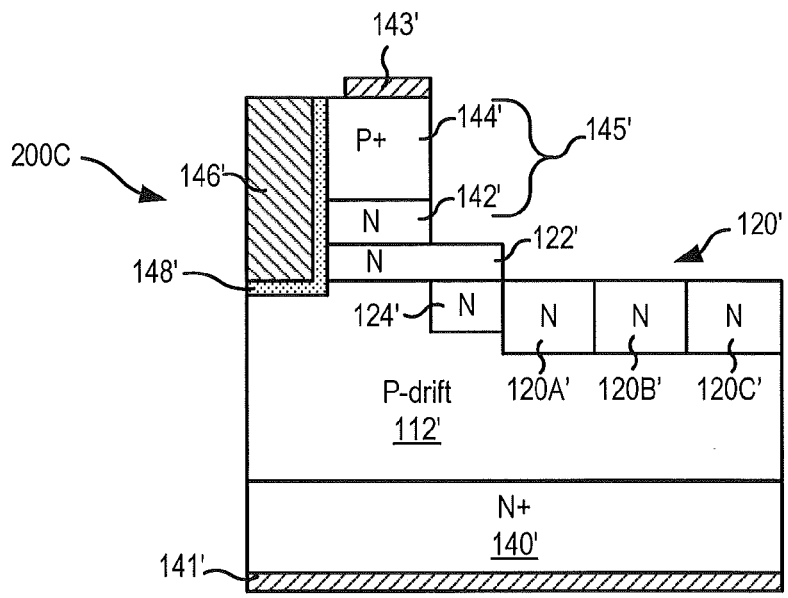

A p-IGBT structure 200C according to some embodiments is illustrated in FIG. 3C. The p-IGBT structure includes a p-type drift layer 112' on an n+ emitter layer 140'. An n-type buffer layer 122' is formed as a first mesa on the p-type drift layer 112', and a second mesa 145' including an n-type layer 142' and a p+ layer 144' is formed on the buffer layer 122'. The buffer layer 122' forms a step that extends over the drift layer 112' past a first sidewall of the second mesa 145', and an n-type buried junction extension 124' is under the step. A gate oxide 148' is formed on a second surface of the second mesa 145' opposite the first surface, and a gate electrode 146' is on the gate oxide 148'.

A junction termination extension region 120' is formed at the surface of the p− drift layer 112' adjacent the buried junction extension 124'. In these embodiments, the JTE region 120' includes n-type JTE zones 120A', 120B', 120C'. Ohmic contacts 143', 141' are formed on the p+ layer 144' and the n+ layer 140', respectively.

Figure 3D:
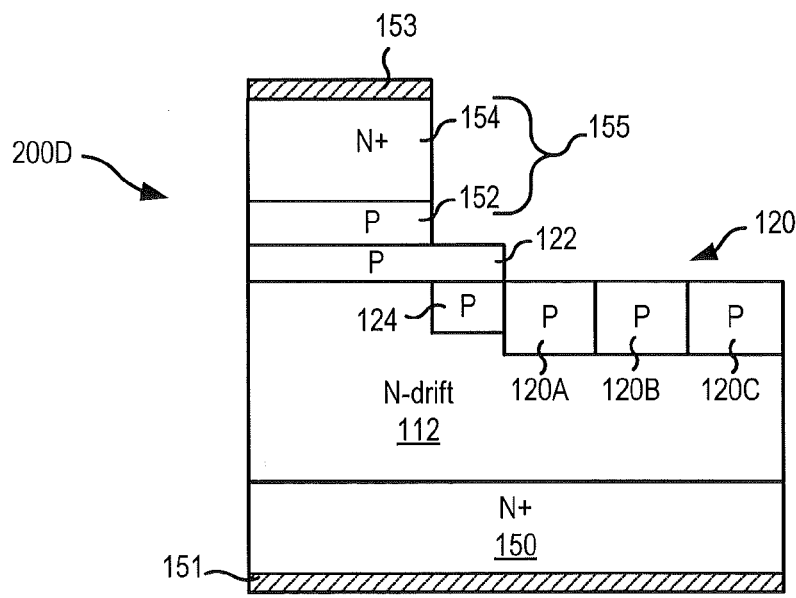

An n-type BJT (bipolar junction transistor) 200D according to some embodiments is illustrated in FIG. 3D. The n-BJT 200D includes an n-type drift layer 112 on an n+ emitter layer 150. A p-type buffer layer 122 is formed as a first mesa on the n-type drift layer 112, and a second mesa 155 including a p-type base layer 152 and an n+ collector layer 154 is formed on the buffer layer 122. The buffer layer 122 forms a step that extends over the drift layer 112 past a first sidewall of the second mesa 155, and a buried junction extension 124 is under the step.

A junction termination extension (JTE) region 120, including p-type JTE zones 120A, 120B, 120C, is formed at the surface of the n− drift layer 112 adjacent the buried junction extension 124. Collector and emitter ohmic contacts 131, 133 are formed on the n+ layers 150, 154, respectively.

Figure 3E:
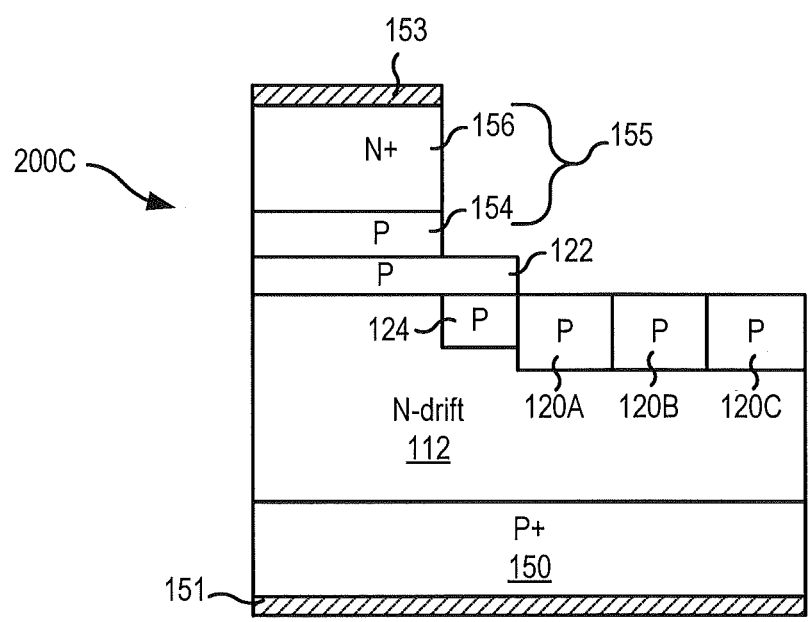

FIG. 3E illustrates an n-type gate turn-off (GTO) thyristor 200E according to some embodiments. The GTO 200E has a similar layer structure as the n-type BJT 200D shown in FIG. 3D, except that the n-type drift layer 112 is formed on a p+ cathode layer 150.

Figure 4:
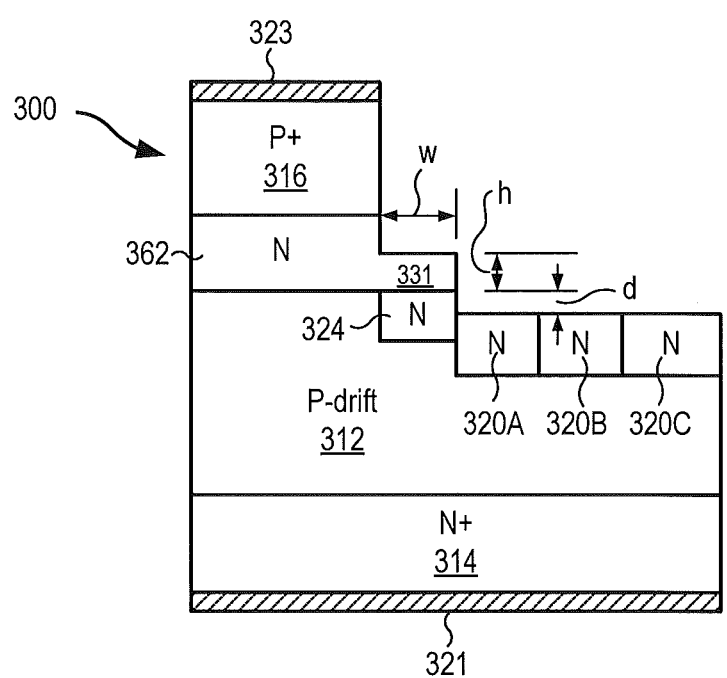
FIG. 4 is a cross-sectional view of a mesa terminated gate turn-off (GTO) thyristor structure according to some embodiments of the present invention.

FIG. 4 illustrates an example p-GTO structure 300 according to some embodiments that is used for simulation purposes. The GTO structure 300 includes a 60 μm thick p-type drift layer 312 on which an n-type base layer 362 is provided as a mesa. The drift layer 312 has a simulated net p-type doping concentration of $3 \times 10^{14}$ cm$^{-3}$ and is provided on an n+ layer 314. In simulations, instead of defining a separate buffer layer, the n-type base layer 362 includes a step portion 331 that extends partially over the drift layer 312. A p+ mesa 316 is on the n-type base layer 362. An n-type buried junction extension 324 is formed in the drift layer 312 beneath the step portion 331 of the base layer 362. A 15-zone junction termination extension (JTE) region 320, including the first three p-type JTE zones 320A, 320B, and 320C for illustration, is provided at the surface of the drift layer 312 adjacent the buried junction extension 324. The first JTE zone 320A has a total dose of about $1 \times 10^{13}$ cm$^{-2}$ with a depth of about 0.5 μm. Anode and cathode ohmic contacts 323, 321 are formed on the p+ layer 316 and the n+ layer 314, respectively.

The step portion 331 of the base layer 362 has a height h of 0.2 to 0.3 μm and a lateral width w (measured from a side surface of the p+ mesa 316) of greater than 10 μM. The base layer 362 has a simulated net doping concentration of $1 \times 10^{17}$ cm$^{-3}$, while the drift layer 312 has a simulated net doping concentration of $2 \times 10^{14}$ cm$^{-3}$. The amount of over-etch of the drift region, shown in FIG. 4 as d, is a simulation parameter.

Figure 5:
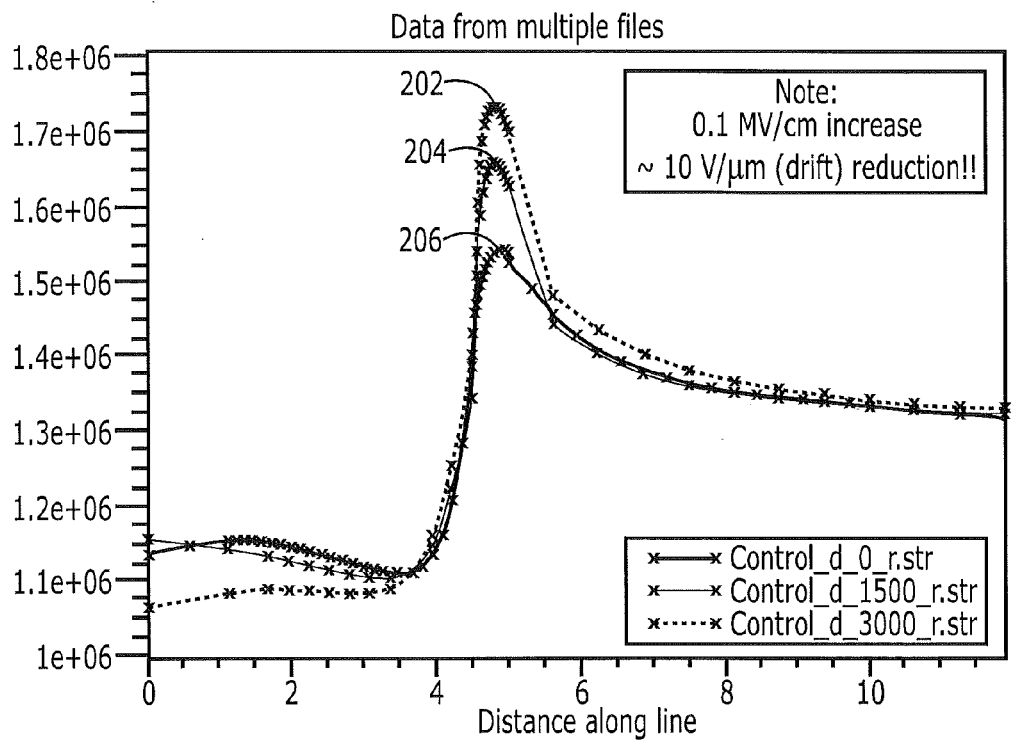
FIGS. 5 to 9 are graphs illustrating simulated device parameters for the GTO structure of FIG. 4.

The operation of the GTO structure 300 illustrated in FIG. 4 was simulated and compared to the performance of a control structure including no step portion extending from the base layer. Electric fields in the control structure were simulated under reverse blocking conditions for various levels of over-etch. The results are illustrated in FIG. 5. In particular, FIG. 5 includes curves 202, 204 and 206, which represent over-etch amounts of 0.3, 0.15 and 0 μm, respectively, in a control structure. In FIG. 5, electric field is shown on the y-axis, while lateral distance across the structure is shown on the x-axis. As shown therein, the peak electric field in the control device increases substantially with the amount of over-etch, from about 1.53 MV/cm with no over-etch up to about 1.73 MV/cm with a 0.3 µm over-etch. An increase in the peak electric field of 0.1 MV/cm may correspond to a decrease in the voltage blocking ability of the structure of about 10 V/µm.

Figure 6:
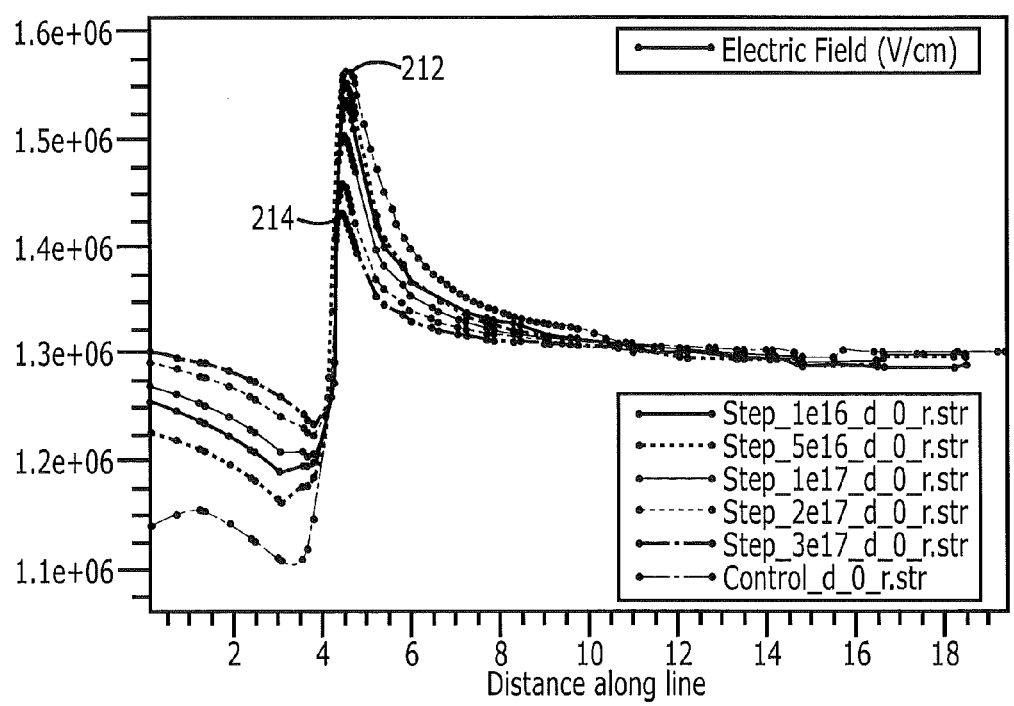

FIG. 6 illustrates the simulated reduction in peak electric field for the GTO structure 300 for various doping levels of the buried junction extension 324 with no over-etch. In FIG. 6, electric field is shown on the y-axis, while lateral distance across the structure is shown on the x-axis. Curve 212 represents the electric field in the control structure. Curve 214 represents the electric field in the GTO structure 300 in which the buried junction extension 324 has a doping concentration of $3 \times 10^{17}$ cm$^{-3}$. As shown in FIG. 6, the peak electric field drops substantially as the doping level of the buried junction extension 324 is increased from $1 \times 10^{16}$ cm$^{-3}$ to $3 \times 10^{17}$ cm$^{-3}$. In particular, at a doping level of the buried junction extension 324 of $3 \times 10^{17}$ cm$^{-3}$, the peak electric field in the device is shown to be reduced by about 0.12 MV/cm.

Figure 7:
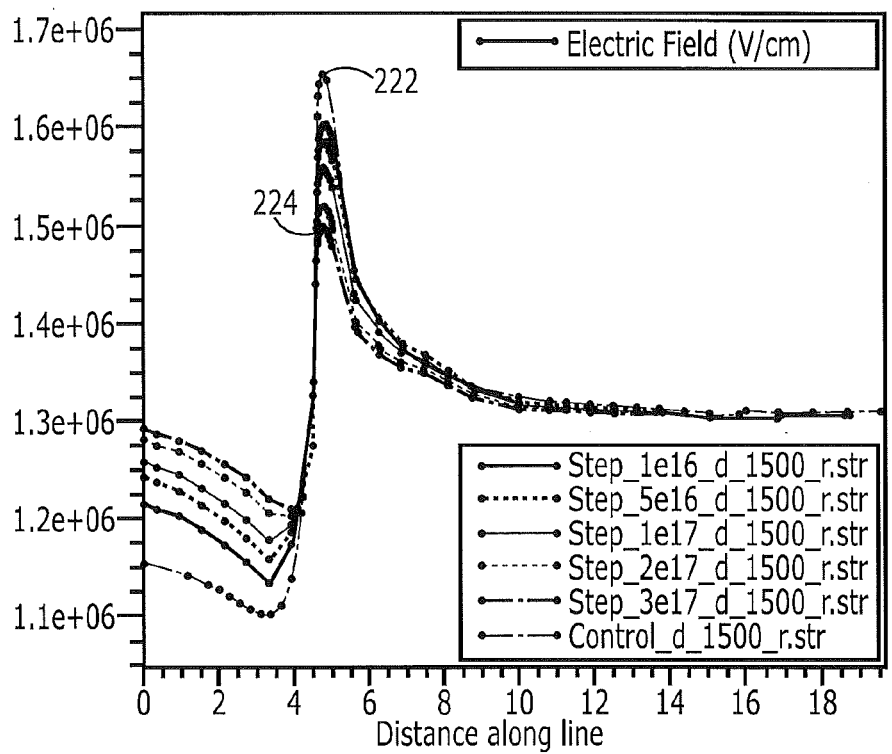

FIG. 7 illustrates the simulated reduction in peak electric field for the GTO structure 300 for various doping levels of the buried junction extension 324 with an over-etch of 0.15 µm. In FIG. 7, electric field is shown on the y-axis, while lateral distance across the structure is shown on the x-axis. Curve 222 represents the electric field in the control structure. Curve 224 represents the electric field in the GTO structure 300 in which the buried junction extension 324 has a doping concentration of $3 \times 10^{17}$ cm$^{-3}$. As shown in FIG. 7, the peak electric field drops substantially as the doping level of the buried junction extension 324 is increased from $1 \times 10^{16}$ cm$^{-3}$ to $3 \times 10^{17}$ cm$^{-3}$ even with an over-etch of 0.15 µm. In particular, at a doping level of the buried junction extension 324 of $3 \times 10^{17}$ cm$^{-3}$, the peak electric field in the device is shown to be reduced by about 0.15 MV/cm.

Figure 8:
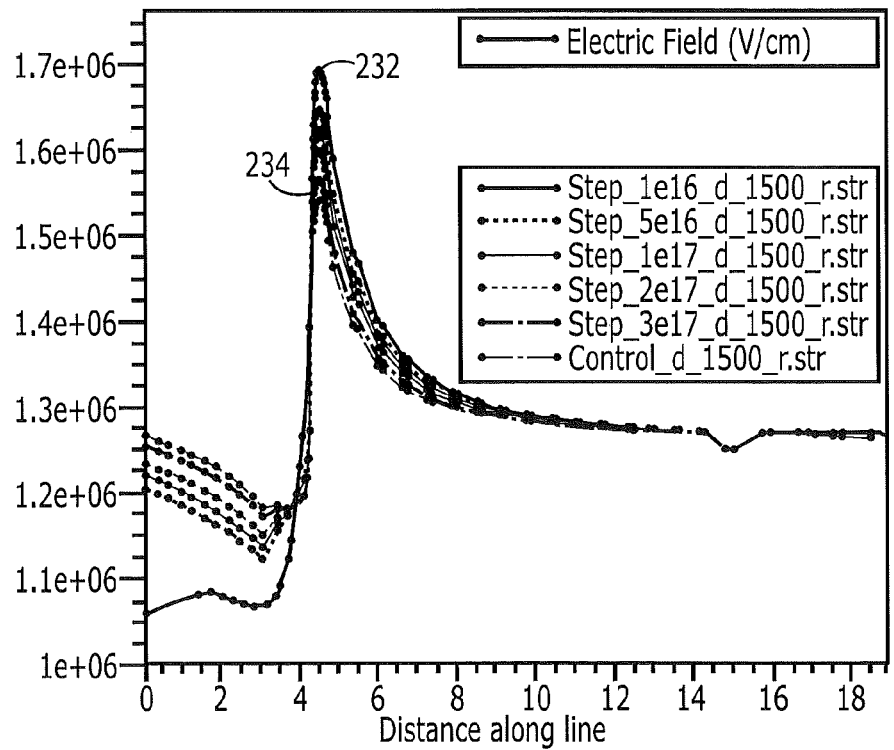

FIG. 8 illustrates the simulated reduction in peak electric field for the GTO structure 300 for various doping levels of the buried junction extension 324 with an over-etch of 0.3 µm. In FIG. 8, electric field is shown on the y-axis, while lateral distance across the structure is shown on the x-axis. Curve 232 represents the electric field in the control structure. Curve 234 represents the electric field in the GTO structure 300 in which the buried junction extension 324 has a doping concentration of $3 \times 10^{17}$ cm$^{-3}$. As shown in FIG. 8, the peak electric field drops substantially as the doping level of the buried junction extension 324 is increased from $1 \times 10^{16}$ cm$^{-3}$ to $3 \times 10^{17}$ cm$^{-3}$ even with an over-etch of 0.3 µm. In particular, at a doping level of the buried junction extension 324 of $3 \times 10^{17}$ cm$^{-3}$, the peak electric field in the device is shown to be reduced by about 0.18 MV/cm.

Figure 9:
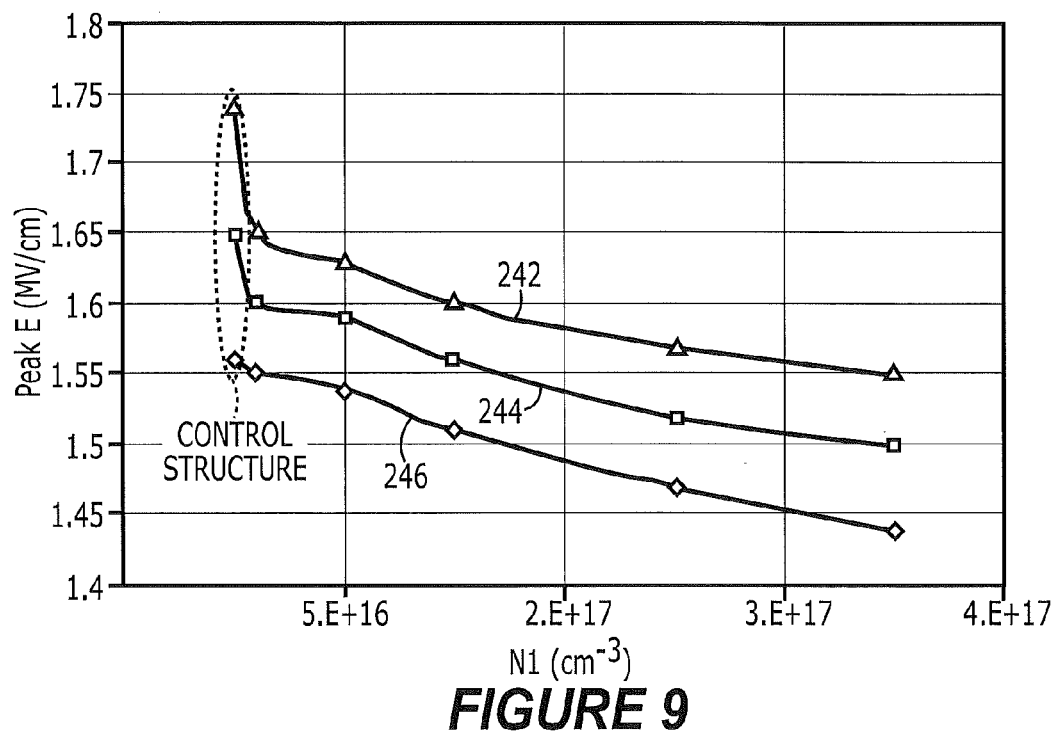

FIG. 9 illustrates the simulated drop in peak electric field for various doping levels of the buried junction extension 324 with various levels of over-etch. In FIG. 9, peak electric field is shown on the y-axis, while doping concentration of the buried junction extension 324 is shown on the x-axis. Curve 242 represents the peak electric field for devices having a 0.3 µm over-etch, curve 244 represents the peak electric field for devices having a 0.15 µm over-etch, and 246 represents the peak electric field for devices having no over-etch. In each case, the peak electric field in the device is shown to be substantially reduced compared to the control structure as the doping level of the buried junction extension 324 is increased from $1 \times 10^{16}$ cm$^{-3}$ to $3.5 \times 10^{17}$ cm$^{-3}$.

Formation of a mesa termination structure according to embodiments of the invention is illustrated in FIGS. 10A-10E. As shown therein, a drift layer 112 is formed on a substrate 114. In the embodiments illustrated in FIGS. 10A-10E, the drift layer 112 is n-type. However, the drift layer 112 can in some embodiments be p-type, and the conductivity of other layers of the structure can be adjusted accordingly.

A p-type preliminary buffer layer 122' is formed on the drift layer 112, for example, by epitaxial growth using chemical vapor deposition (CVD). The preliminary buffer layer 122' has a thickness of about 0.2 to about 0.3 µm, and has a doping concentration of about $1 \times 10^{16}$ cm$^{-3}$ to about $3 \times 10^{17}$ cm$^{-3}$. A preliminary p+ layer 116' is formed on the preliminary buffer layer 122', for example, by epitaxial growth using chemical vapor deposition (CVD).

Figure 10A:
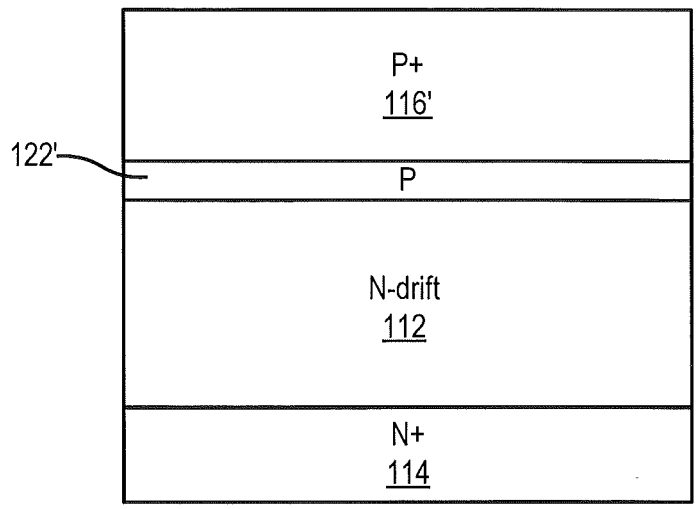
FIGS. 10A to 10E are cross-sectional views illustrating operations of forming mesa terminated power semiconductor structures according to some embodiments of the present invention.
Figure 10B:
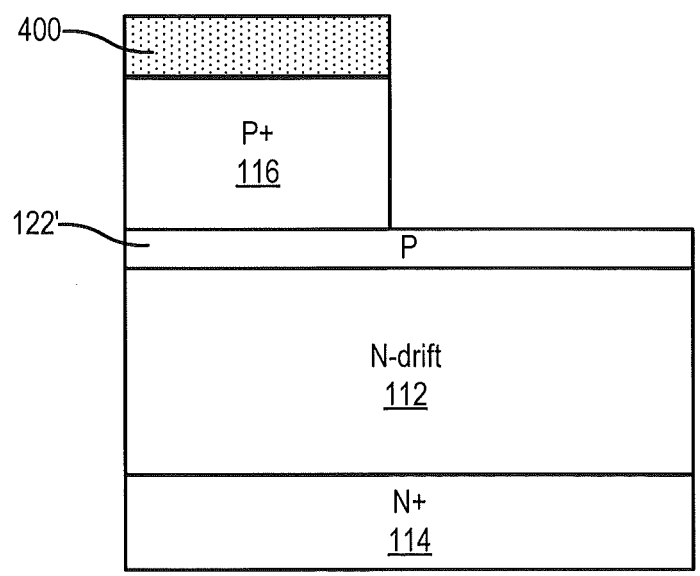
Figure 10C:
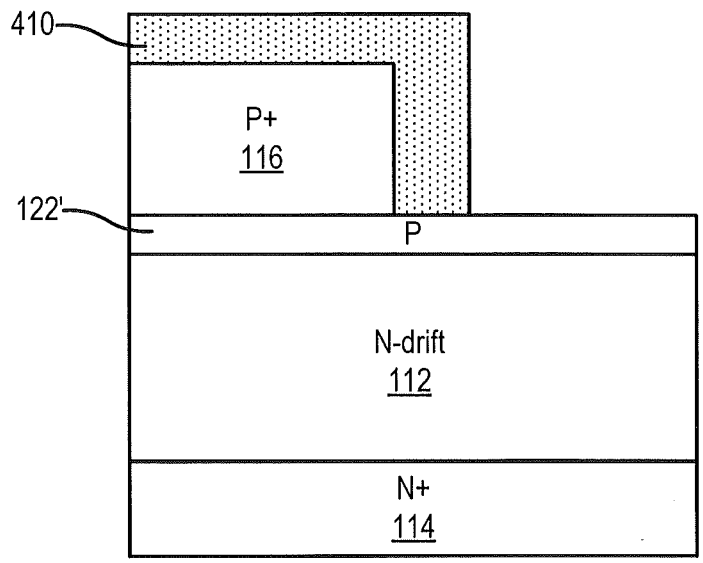
Figure 10D:
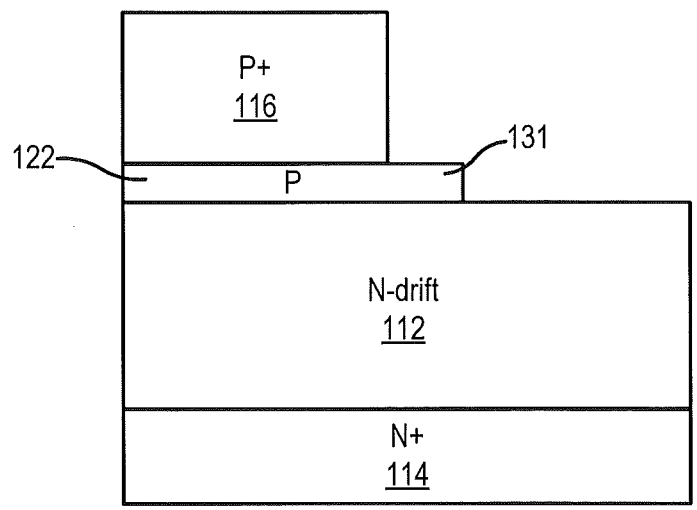

Referring to FIG. 10B, a first etch mask 400 is formed on the preliminary p+ layer 116', and the preliminary p+ layer 116' is dry etched to form a p+ mesa 116. Referring to FIG. 10C, a second etch mask 410 is formed on the p+ mesa 116 and extends partially onto the preliminary buffer layer 122'. The preliminary buffer layer 122' is then dry etched to form the buffer layer 122 including a mesa step portion 131 that extends laterally across the drift layer 112 past a sidewall of the p+ mesa 116.

Etching of the preliminary p+ layer 116' and the preliminary buffer layer 122' may be performed using dry etching, such as reactive ion etching, using a fluorine based etch chemistry. Other dry etch techniques, such as inductively coupled plasma (ICP), may be used. Depth control of the etch may be performed by probing the etched surface and applying a voltage to the etched surface during etching. A level of current passing through the probes in response to the applied voltage changes as the doping concentration of the layer being etched changes.

Figure 10E:
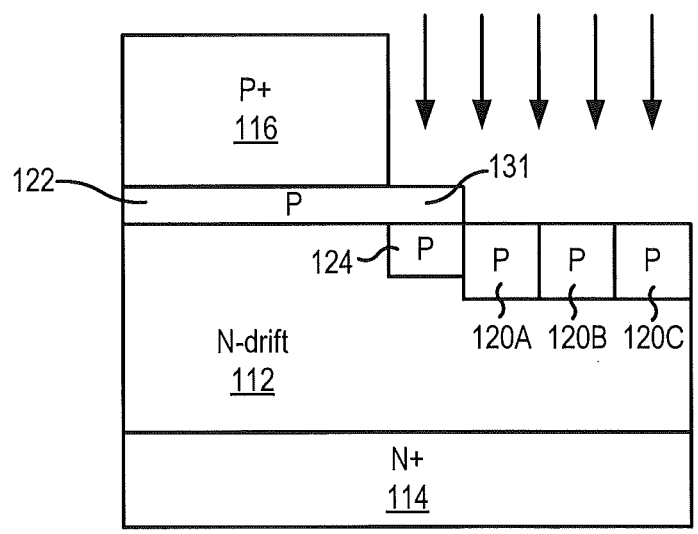

Referring to FIG. 10E, p-type dopants are then implanted into the surface of the drift layer 112 adjacent the p+ mesa 116 to form a buried junction extension 124 beneath the mesa step 131, and to form the junction termination extension zones 120A, 120B, 120C, etc., in the surface of the drift layer 112. According to some embodiments, a multi-step implant schedule may be followed in order to create a buried junction extension 124 having a desired doping profile. Different implant masks may be used to selectively expose different regions of the drift layer 112 for implantation. For example, a doping schedule as shown in Table 1 may be used to implant nitrogen in a p-type drift layer to form a buried junction extension having a doping profile that extends for about 0.6 µm in silicon carbide at a doping concentration of about $1 \times 10^{17}$ cm$^{-3}$.

TABLE 1

Implant Schedule

| Step | Implant Energy (keV) | Implant Dose (cm$^{-2}$) |
| --- | --- | --- |
| 1 | 40 | $7 \times 10^{11}$ |
| 2 | 100 | $1 \times 10^{12}$ |
| 3 | 200 | $2.2 \times 10^{12}$ |
| 4 | 280 | $2.6 \times 10^{12}$ |
| 5 | 360 | $4 \times 10^{12}$ |

Embodiments of the invention may be advantageously employed in silicon carbide based power semiconductor devices. However the invention is not limited to silicon carbide, but embodiments thereof can be applied to power semiconductor devices based on other material systems, including materials systems based on silicon, SiGe, GaAs, GaN, and others. Furthermore, embodiments of the invention may be advantageously employed with any power semiconductor structure including a drift layer and a mesa termination, including MOSFETs, IGBTs, GTOs, BJTs, MCTs (MOS-controlled thyristors), and other unipolar and/or bipolar device structures.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an electronic device, comprising:
    forming a preliminary buffer layer having a second conductivity type on a drift layer having a first conductivity type;
    forming a first layer having the second conductivity type on the preliminary buffer layer;
    selectively etching the first layer to form a first mesa that exposes a portion of the preliminary buffer layer;
    selectively etching the exposed portion of the preliminary buffer layer to form a second mesa that covers a first portion of the drift layer, that exposes a second portion of the drift layer, and that includes a mesa step that protrudes from the first mesa;
    selectively implanting second conductivity type dopants into the drift layer adjacent the second mesa to form a junction termination region in the drift layer; and
    selectively implanting second conductivity type dopants through a horizontal surface of the mesa step into the first portion of the drift layer beneath the mesa step to form a buried junction extension in the drift layer;
    wherein a first side of the buried junction extension is vertically aligned with a vertical sidewall of the first mesa and a second side of the buried junction extension is vertically aligned with a vertical sidewall of the second mesa.

2. The method of claim 1, wherein the second conductivity type is opposite the first conductivity type.

3. The method of claim 1, wherein the buffer layer has a thickness of about 0.2 μm to about 0.3 μm, and wherein the buried junction extension has a net doping concentration of about $1 \times 10^{16}$ cm$^{-3}$ to about $4 \times 10^{17}$ cm$^{-3}$.

4. The method of claim 1, wherein the buried junction extension extends into the drift layer to a depth beneath the buffer layer of about 0.3 μm.

5. The method of claim 1, wherein the horizontal surface of the mesa step is defined between the vertical sidewall of the first mesa and the vertical sidewall of the second mesa.

6. The method of claim 1, wherein selectively etching the exposed portion of the preliminary buffer layer to form the second mesa comprises etching the second portion of the drift layer.

7. The method of claim 1, further comprising:
    providing a substrate; and
    forming the drift layer on the substrate, wherein the substrate has the first conductivity type.

8. The method of claim 1, further comprising:
    providing a substrate; and
    forming the drift layer on the substrate, wherein the substrate has the second conductivity type.

9. The method of claim 1, further comprising:
    forming a second layer having the first conductivity type on the first layer, wherein selectively etching the first layer to form the first mesa comprises selectively etching the second layer.

* * * * *